（12）United States Patent
Hikichi et al.

(10) Patent No.: US 12,095,452 B2
(45) Date of Patent: Sep. 17, 2024

(54) VOLTAGE FLUCTUATION DETECTION CIRCUIT

(71) Applicant: ABLIC Inc., Tokyo (JP)

(72) Inventors: Tomoki Hikichi, Tokyo (JP); Takahiro Ito, Tokyo (JP)

(73) Assignee: ABLIC Inc., Nagano (JP)

( * ) Notice: Subject to any disclaimer, the term of this patent is extended or adjusted under 35 U.S.C. 154(b) by 20 days.

(21) Appl. No.: 18/185,395

(22) Filed: Mar. 17, 2023

(65) Prior Publication Data

US 2023/0308096 A1 Sep. 28, 2023

(30) Foreign Application Priority Data

Mar. 22, 2022 (JP) .................................. 2022-045277
Jul. 19, 2022 (JP) .................................. 2022-114649

(51) Int. Cl.
*H03K 17/22* (2006.01)
*H03K 17/08* (2006.01)
*H03K 19/003* (2006.01)
*H03K 19/0185* (2006.01)

(52) U.S. Cl.
CPC ........... *H03K 17/223* (2013.01); *H03K 17/08* (2013.01); *H03K 19/00384* (2013.01); *H03K 19/018507* (2013.01)

(58) Field of Classification Search
None
See application file for complete search history.

(56) References Cited

U.S. PATENT DOCUMENTS 7,834,680 B2 * 11/2010 Kim ...................... G11C 5/145
327/543

FOREIGN PATENT DOCUMENTS

JP H08129020 5/1996

* cited by examiner

*Primary Examiner* — Jeffrey S Zweizig
(74) *Attorney, Agent, or Firm* — JCIPRNET

(57) ABSTRACT

A voltage fluctuation detection circuit includes: a source voltage decrease detection circuit configured to detect a decrease in voltage of a first power supply which outputs a first voltage and to output the result of detection as a voltage decrease detection signal using a second voltage which is lower than the voltage of the first power supply; an erroneous detection prevention circuit configured to detect an increase in voltage of the first power supply and to output the result of detection as a voltage increase detection signal using the second voltage; and a transistor configured to mask outputting of the voltage decrease detection signal in a period in which the increase in voltage of the first power supply is being detected based on the voltage increase detection signal.

8 Claims, 4 Drawing Sheets

VOLTAGE FLUCTUATION DETECTION CIRCUIT

CROSS-REFERENCE TO RELATED APPLICATION

This application claims the priority benefit of Japan application serial no. 2022-045277, filed on Mar. 22, 2022 and Japan application serial no. 2022-114649, filed on Jul. 19, 2022. The entirety of the above-mentioned patent applications is hereby incorporated by reference herein and made a part of this specification.

BACKGROUND

Technical Field

The present invention relates to a voltage fluctuation detection circuit.

Related Art

In the related art, a technique of detecting a voltage fluctuation by comparing a source voltage with a predetermined reference voltage is known in the technical field for detecting a voltage fluctuation of a power source mounted in a vehicle.

When it is intended to detect a source voltage fluctuation using the aforementioned technique according to the related art, a semiconductor element with a high breakdown voltage corresponding to a source voltage is necessary.

SUMMARY

According to an embodiment of the present invention, there is provided a voltage fluctuation detection circuit including: a source voltage decrease detection circuit configured to detect a decrease in voltage of a first power supply which outputs a first voltage and to output the result of detection as a voltage decrease detection signal using a second voltage of a second power supply which is lower than the voltage of the first power supply; an erroneous detection prevention circuit configured to detect an increase in voltage of the first power supply and to output the result of detection as a voltage increase detection signal using the second voltage; and a mask circuit configured to invalidate outputting of the voltage decrease detection signal in a period in which the increase in voltage of the first power supply is being detected based on the voltage increase detection signal.

According to the embodiment of the present invention, it is possible to provide a voltage fluctuation detection circuit which can detect a source voltage fluctuation using a semiconductor element with a low breakdown voltage.

DESCRIPTION OF THE EMBODIMENTS

Embodiments of the present invention provide a voltage fluctuation detection circuit which can allow a semiconductor element with a low breakdown voltage to be used.

First Embodiment

An exemplary embodiment of a voltage fluctuation detection circuit according to an aspect of the present invention will be posted and described below in detail with reference to the accompanying drawings. The aspect of the present invention is not limited to the embodiment and may include various modifications or improvements thereof. Various omissions, replacements, or alterations of elements can be performed without departing from the gist of the present invention.

[Voltage Fluctuation Detection Circuit]

Figure 1:
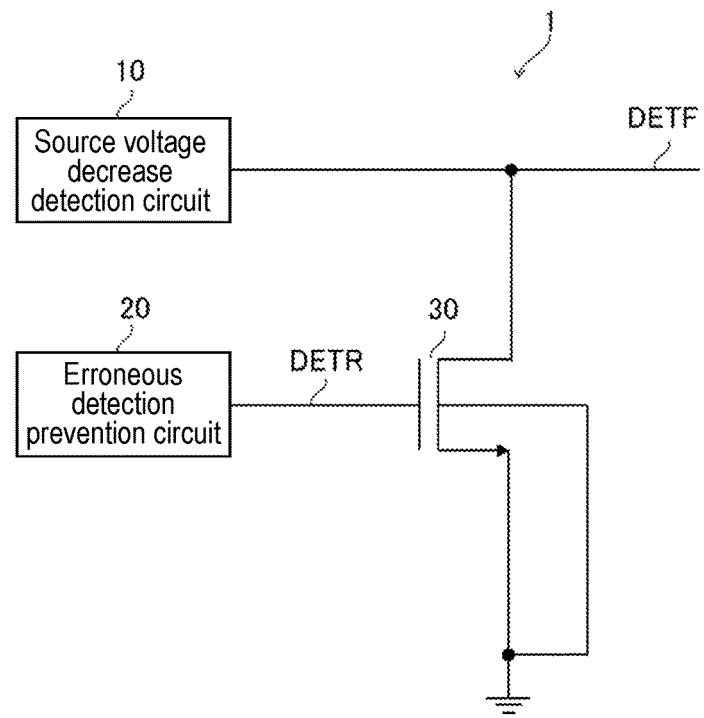
FIG. 1 is a diagram illustrating an example of a functional configuration of a voltage fluctuation detection circuit according to an embodiment.

FIG. 1 is a diagram illustrating an example of a functional configuration of a voltage fluctuation detection circuit according to an embodiment. An example of a functional configuration of a voltage fluctuation detection circuit 1 will be described below with reference to the drawing.

The voltage fluctuation detection circuit 1 detects a fluctuation of a predetermined source voltage. The predetermined source voltage is, for example, a voltage which is not applied to a gate terminal of a thin-film transistor with a thin gate insulating film and with a low gate dielectric breakdown voltage (a semiconductor element with a low breakdown voltage) and which requires use of a thick-film transistor with a thick gate insulating film and with a high gate dielectric breakdown voltage (a semiconductor element with a high breakdown voltage) for the purpose of breakdown protection. Specifically, a lead battery can be used as a detection target of the voltage fluctuation detection circuit 1. Hereinafter, an example in which the detection target of the voltage fluctuation detection circuit 1 is a power supply of a 12 V system such as a lead battery will be described.

In the following description, the power supply which is the detection target of the voltage fluctuation detection circuit 1 may be referred to as a first power supply, and a voltage output from the first power supply may be referred to as a first voltage or an HV source voltage.

The voltage fluctuation detection circuit 1 includes a source voltage decrease detection circuit 10, an erroneous detection prevention circuit 20, and a transistor 30 which operates as a mask circuit. The source voltage decrease detection circuit 10 outputs a voltage decrease detection signal DETF. The erroneous detection prevention circuit 20 outputs a voltage increase detection signal DETR.

A control unit which is not illustrated receives the voltage decrease detection signal DETF output from the source voltage decrease detection circuit 10. Although not illustrated in FIG. 1, the control unit which is not illustrated may similarly receive the voltage increase detection signal DETR.

The source voltage decrease detection circuit 10 detects a decrease of the first voltage. Specifically, the source voltage decrease detection circuit 10 detects that a decrease per unit time (a negative slope) of the first voltage is equal to or greater than a predetermined value. The source voltage decrease detection circuit 10 outputs the detection result as the voltage decrease detection signal DETF. The voltage decrease detection signal DETF is L (a low level) at the time of normality and is H (a high level) at the time of detection of a decrease in voltage.

Here, a second source voltage may be generated, for example, by a series regulator with the first source voltage as an input or the like. Since the voltage decrease detection signal DETF is driven by the second source voltage, the voltage level of the voltage decrease detection signal DETF is lower than the first voltage. In the following description, the voltage level of the voltage decrease detection signal DETF may be referred to as a second voltage or an LV source voltage. The voltage level of the second voltage may be, for example, 5 V or 3.3 V.

The erroneous detection prevention circuit 20 detects an increase of a source voltage. Specifically, the erroneous detection prevention circuit 20 detects that an increase per unit time (a positive slope) of the source voltage is equal to or greater than a predetermined value. The erroneous detection prevention circuit 20 outputs the detection result as the voltage increase detection signal DETR. The voltage increase detection signal DETR is L at the time of normality and is H at the time of detection of an increase in voltage. The voltage level of the voltage increase detection signal DETR is lower than the source voltage. The voltage level of the voltage increase detection signal DETR may be specifically equal to the voltage level of the voltage decrease detection signal DETF.

Here, the source voltage decrease detection circuit 10 may output an erroneous detection signal indicating a decrease in source voltage (that is, may instantaneously output the voltage decrease detection signal DETF of H) at the time of starting of a power supply, at the time of increasing of the voltage, or the like. The time of starting of the power supply is, for example, a case in which the source voltage increases from 0 V to 12 V, and the time of increasing the voltage is, for example, a case in which the source voltage increases from 12 V to 24 V. In the case where the source voltage decrease detection circuit 10 outputs an erroneous detection signal at the time of starting of a power supply, at the time of increasing of the voltage, or the like, the erroneous detection prevention circuit 20 prohibits the erroneous detection signal from being transmitted to a subsequent stage.

The transistor 30 is an N-channel metal-oxide-semiconductor field-effect transistor (MOSFET). A gate terminal of the transistor 30 receives the voltage increase detection signal DETR output from the erroneous detection prevention circuit 20. A drain terminal of the transistor receives the voltage decrease detection signal DETF output from the source voltage decrease detection circuit 10. A source terminal of the transistor 30 is connected to a third power supply terminal 103 and is grounded.

In the following description, a gate terminal, a source terminal, a drain terminal, and a bulk terminal (a back-gate, a substrate, or a body) of a transistor may be simply referred to as a gate, a source, a drain, and a bulk.

The transistor 30 invalidates (masks) outputting of the voltage decrease detection signal DETF in a period in which an increase of the source voltage is being detected based on the voltage increase detection signal DETR. The transistor 30 is also referred to as a mask circuit. Specifically, the drain and the source of the transistor 30 are turned on by changing the voltage increase detection signal DETR to H, and the voltage decrease detection signal DETF is fixed to L.

[Circuit Configuration of Source Voltage Decrease Detection Circuit]

Figure 2:
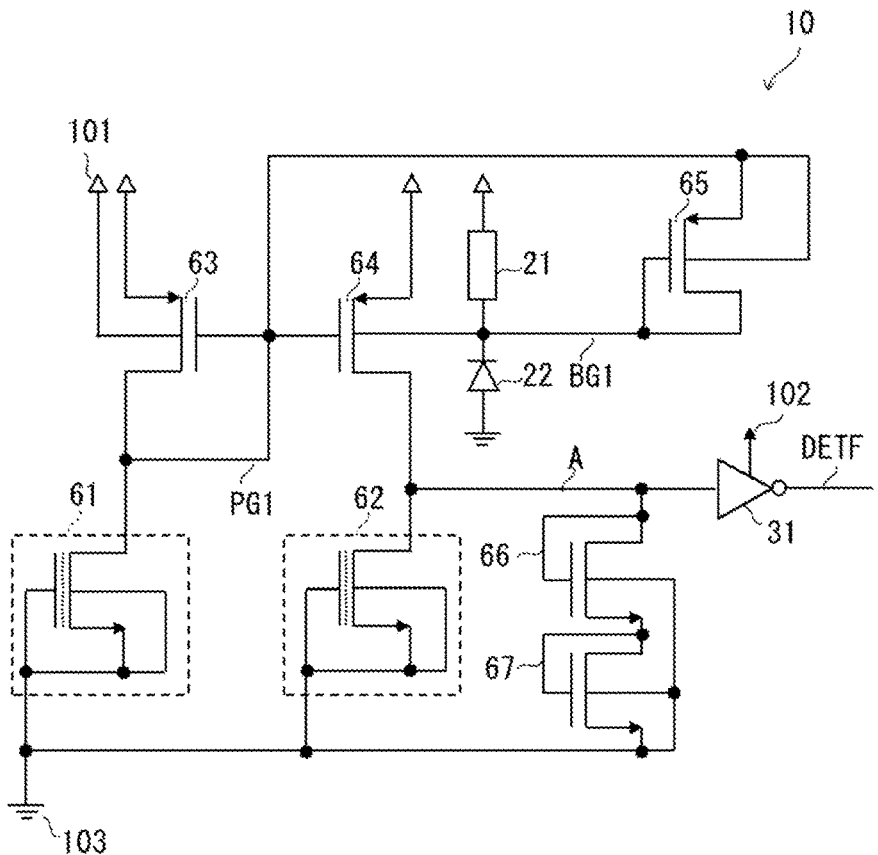
FIG. 2 is a circuit diagram illustrating an example of a circuit configuration of a source voltage decrease detection circuit according to the embodiment.

FIG. 2 is a circuit diagram illustrating an example of a circuit configuration of the source voltage decrease detection circuit 10 according to the first embodiment. First, an example of a detailed circuit configuration of the source voltage decrease detection circuit 10 will be described with reference to the drawing. The source voltage decrease detection circuit 10 includes a load 61, a load 62, transistors 63 to 67, a resistor 21, a parasitic diode 22, and an inverter 31.

A first power supply terminal 101 illustrated in the drawing is an example of a power supply terminal which is connected to a power supply (a first power supply) serving as a detection target of the voltage fluctuation detection circuit 1, and a second power supply terminal 102 is an example of a power supply terminal which is connected to a logical power supply (a second power supply) used for signal processing. A third power supply terminal 103 is, for example, a ground potential or a negative source potential. Accordingly, the first power supply terminal 101 and the second power supply terminal 102 use the third power supply terminal 103 as a common reference potential.

The transistor 63 is a current-mirror P-channel MOSFET. A source and a bulk of the transistor 63 are connected to the first power supply terminal 101. A gate and a drain of the transistor 63 are connected to each other. In the following description, a connection point between the gate and the drain of the transistor 63 may also be referred to as a node PG1. The transistor 63 may also be referred to as a first transistor.

The transistor 63 is a thin-film transistor (a semiconductor element with a low breakdown voltage) in which a gate insulating film (a gate oxide film) is formed in a thin film shape.

The load 61 is a current source load. Specifically, the load 61 is a depression type N-channel MOSFET. One end (a drain) of the load 61 is connected to the connection point (the node PG1) between the gate and the drain of the transistor 63. The other ends (a gate, a source, and a bulk) of the load 61 are grounded via the third power supply terminal 103. In the following description, the load 61 may also be referred to as a first load.

The transistor 64 is a current-mirror P-channel MOSFET. A gate of the transistor 64 is connected to the connection point (the node PG1) between the gate and the drain of the transistor 63. A source of the transistor 64 is connected to the first power supply terminal 101. A drain of the transistor 64 is connected to one end of the load 62. A bulk of the transistor 64 is connected to a gate and a drain of the transistor 65. In the following description, a connection point between the drain of the transistor 64 and the load 62 may be referred to as a node A. A connection point between a connection point between the gate and the drain of the transistor 65 and the bulk of the transistor 64 may be referred to as a node BG1. In the following description, the transistor 64 may be referred to as a second transistor.

The transistor 64 is a thin-film transistor (a semiconductor element with a low breakdown voltage).

The load 62 is a current source load. Specifically, the load 62 is a depression type N-channel MOSFET. One end (a drain) of the load 62 is connected to the drain of the transistor 64. The other ends (a gate, a source, and a bulk) of the load 62 are grounded via the third power supply terminal 103. In the following description, the load 62 may also be referred to as a second load.

A resistance value of the load 62 is preferably set such that the potential of the node A is equal to or greater than an H level (that is, a threshold voltage of the inverter 31) by dividing the voltage of the first power supply terminal 101 in cooperation with the transistor 64. The potential of the node A is clamped by a clamp circuit which will be described later, and thus can satisfactorily be the threshold voltage of the inverter 31.

The transistor 65 is a P-channel MOSFET. The gate and the drain of the transistor 65 are connected to each other and are connected to the bulk of the transistor 64. The source and the bulk of the transistor 65 are connected to each other and are connected to the gate of the transistor 63 and the gate (the node PG1) of the transistor 64. In the following description, the transistor 65 may be referred to as a third transistor.

The transistor 65 is a thin-film transistor (a semiconductor element with a low breakdown voltage).

The resistor 21 and the parasitic diode 22 determine a time constant of the transistor 64. Specifically, the parasitic diode 22 is a parasitic diode which is formed between the well and the bulk of the transistor 64. That is, the time constant of the transistor 64 is determined by a capacitive component of the parasitic diode of the transistor 64 and a resistance value of the resistor 21. The resistor 21 and the parasitic diode 22 may be referred to as a time constant determination circuit.

A capacitor may be provided instead of the parasitic diode 22, but in the case where a capacitor is provided, a thick film process which is a process of manufacturing a semiconductor element with a high breakdown voltage has to be used. In this embodiment, by using the parasitic diode 22 instead of the capacitor to determine the time constant of the transistor 64, it is possible to manufacture a semiconductor element without using a thick film process.

The transistor 66 and the transistor 67 are N-channel MOSFETs which are used to clamp the voltage of the connection point (the node A) between the drain of the transistor 64 and the load 62. The voltage of the node A is clamped to a drain-source potential of the transistor 66 and the transistor 67. The transistor 66 and the transistor 67 operate as a clamp circuit which holds the voltage of the node A within a predetermined range from the voltage of the third power supply terminal. In this embodiment, two transistors including the transistor 66 and the transistor 67 are used, but one or more transistors may be used depending on a clamp voltage. When the number of transistors is defined as n (where n is a natural number equal to or greater than 1), a drain-source potential of a transistor is defined as NchVth, and the potential of the third power supply terminal 103 is defined as VSS, the clamp voltage is represented as VSS+n×NchVth. The clamp voltage is determined according to a maximum input voltage of the inverter 31.

The inverter 31 includes an input port, an output port, and a power supply terminal. The second power supply terminal 102 is connected to the power supply terminal of the inverter 31. The input port of the inverter 31 receives the voltage of the node A. The output port of the inverter 31 outputs the voltage decrease detection signal DETF. That is, the source voltage decrease detection circuit 10 outputs a signal based on the potential of the connection point (the node A) between the drain of the transistor 64 and the load 62 as the voltage decrease detection signal DETF.

[Operation of Source Voltage Decrease Detection Circuit]

An example of the operation of the source voltage decrease detection circuit 10 will be described below with reference to FIG. 2.

In a normal state, that is, in the case where there is no voltage fluctuation of the first power supply terminal 101, the potential of the node A is H. In other words, the potential of the connection point (the node A) between the drain of the transistor 64 and the load 62 in the case where the erroneous detection prevention circuit 20 is not detecting a decrease in voltage of the first power supply terminal 101 is H.

As described above, the potential of the node A is clamped by the transistor 66 and the transistor 67. Since the potential of the node A is clamped to a predetermined voltage, the input port of the inverter 31 is not broken down even if the input side of the inverter 31 is manufactured with a transistor with a low breakdown voltage and with a thin gate oxide film. Since the input port of the inverter 31 receives H, the inverter 31 outputs L and the voltage decrease detection signal DETF is L. That is, the voltage decrease detection signal DETF in the case where the erroneous detection prevention circuit 20 is not detecting a decrease in voltage of the first power supply terminal 101 is L.

In the case where the voltage of the first power supply terminal 101 decreases steeply, the bulk potential decreases later than the source potential by the time constant based on the resistor 21 and the capacitance of the parasitic diode 22 due to the resistor 21 present between the bulk of the transistor 64 and the first power supply terminal 101. Accordingly, since the transistor 64 is turned off due to a back-gate effect, the potential of the node A is changed from H to L. Since the input port of the inverter 31 receives L, the inverter 31 outputs H and the voltage decrease detection signal DETF is H.

At this time, the gate of the transistor 63 is protected by self-clamping based on the gate-source voltage of the transistor 63. The gate of the transistor 64 is clamped by the gate-source voltage of the transistor 65 and thus is protected. The transistor 65 operates as a clamp circuit which holds the gate voltage of the transistor 64 within a predetermined range from the first source voltage. Accordingly, all the transistors in the source voltage decrease detection circuit 10 are protected in breakdown voltage.

[Circuit Configuration of Erroneous Detection Prevention Circuit]

Figure 3:
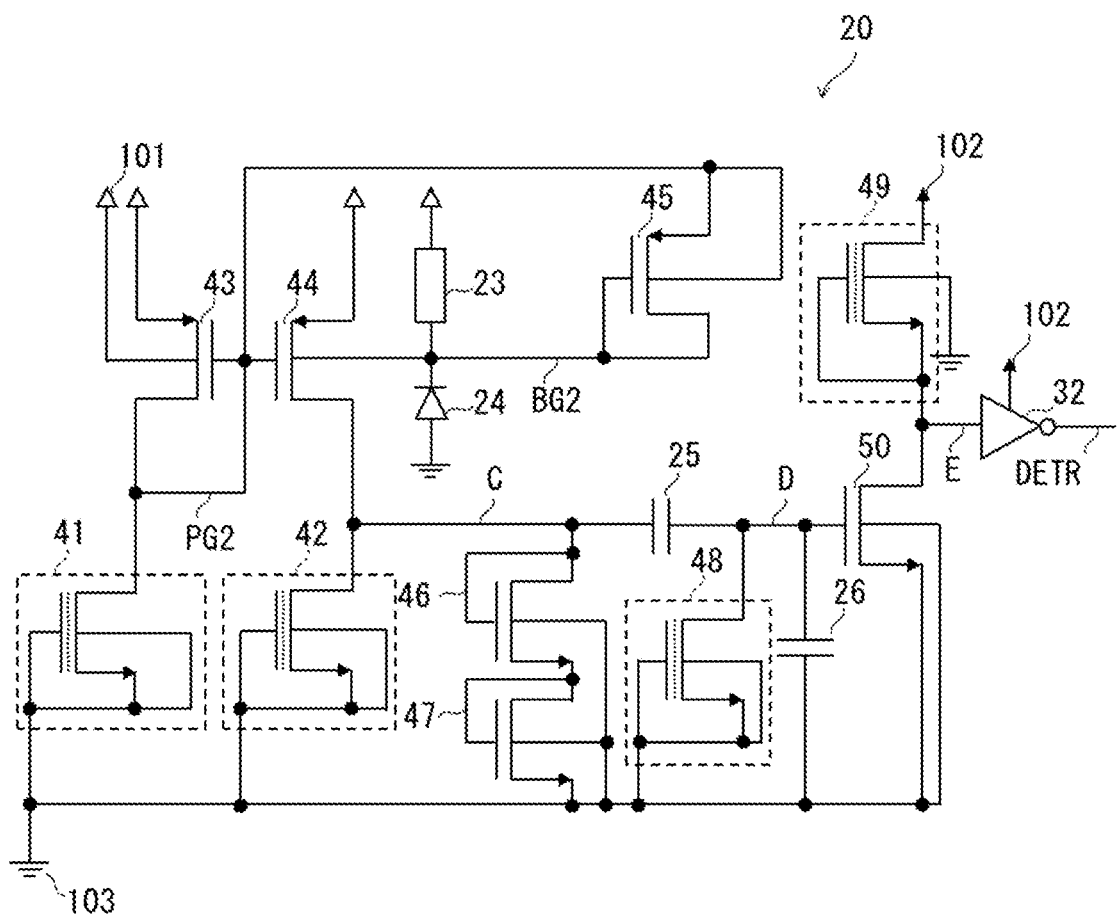
FIG. 3 is a circuit diagram illustrating an example of a circuit configuration of an erroneous detection prevention circuit according to the embodiment.

FIG. 3 is a circuit diagram illustrating an example of a circuit configuration of the erroneous detection prevention circuit according to the first embodiment. An example of a detailed circuit configuration of the erroneous detection prevention circuit 20 will be described below with reference to the drawing. The erroneous detection prevention circuit 20 includes a load 41, a load 42, transistors 43 to 50, a resistor 23, a parasitic diode 24, a capacitor 25, a capacitor 26, and an inverter 32. In description of the erroneous detection prevention circuit 20, the same elements as in the source voltage decrease detection circuit 10 will be referred to by the same reference signs and thus description thereof may be omitted.

The transistor 43 is a current-mirror P-channel MOSFET. A source and a bulk of the transistor 43 are connected to the first power supply terminal 101. A gate and a drain of the transistor 43 are connected to each other. In the following description, a connection point between the gate and the drain of the transistor 43 may also be referred to as a node PG2. The transistor 43 may also be referred to as a fourth transistor.

The transistor 43 is a thin-film transistor (a semiconductor element with a low breakdown voltage).

The load 41 is a current source load. Specifically, the load 41 is a depression type N-channel MOSFET. One end (a drain) of the load 41 is connected to the connection point (the node PG2) between the gate and the drain of the transistor 43. The other ends (a gate, a source, and a bulk) of the load 41 are grounded via the third power supply terminal 103. In the following description, the load 41 may also be referred to as a third load.

The transistor 44 is a current-mirror P-channel MOSFET. A gate of the transistor 44 is connected to the connection point (the node PG2) between the gate and the drain of the transistor 43. A source of the transistor 44 is connected to the first power supply terminal 101. A drain of the transistor 44 is connected to one end of the load 42. A bulk of the transistor 44 is connected to a gate and a drain of the transistor 45. In the following description, a connection point between the drain of the transistor 44 and the load 42 may be referred to as a node C. A connection point between a connection point between the gate and the drain of the transistor 45 and the bulk of the transistor 44 may be referred to as a node BG2. In the following description, the transistor 44 may be referred to as a fifth transistor.

The transistor 44 is a thin-film transistor (a semiconductor element with a low breakdown voltage).

The load 42 is a current source load. Specifically, the load 42 is a depression type N-channel MOSFET. One end (a drain) of the load 42 is connected to the drain of the transistor 44. The other ends (a gate, a source, and a bulk) of the load 42 are grounded via the third power supply terminal 103. In the following description, the load 42 may also be referred to as a fourth load.

A resistance value of the load 42 is preferably set such that the potential of the node C is equal to or less than an L level (that is, the threshold voltage of the inverter 31) by dividing the voltage of the first power supply terminal 101 in cooperation with the transistor 44. In the case where an on-resistance of the transistor 44 is equal to an on-resistance of the transistor 64, an on-resistance of the load 42 is less than an on-resistance of the load 62.

The transistor 45 is a P-channel MOSFET. The gate and the drain of the transistor 45 are connected to each other and are connected to the bulk of the transistor 44. The source and the bulk of the transistor 45 are connected to each other and are connected to the gate of the transistor 43 and the gate (the node PG2) of the transistor 44. In the following description, the transistor 45 may be referred to as a sixth transistor. The transistor 45 is a thin-film transistor (a semiconductor element with a low breakdown voltage).

The resistor 23 and the parasitic diode 24 determine a time constant of the transistor 44. Specifically, the parasitic diode 24 is a parasitic diode of the transistor 44. That is, the time constant of the transistor 44 is determined by a capacitive component of the parasitic diode of the transistor 44 and a resistance value of the resistor 23. The resistor 23 and the parasitic diode 24 may be referred to as a time constant determination circuit.

A capacitor may be provided instead of the parasitic diode 24, but in the case where a capacitor is provided, a thick film process has to be used. In this embodiment, by using the parasitic diode 24 instead of the capacitor to determine the time constant of the transistor 44, it is possible to manufacture a semiconductor element without using a thick film process.

The transistor 46 and the transistor 47 are N-channel MOSFETs which are used to clamp the voltage of the connection point (the node C) between the drain of the transistor 44 and the load 42. The voltage of the node C is clamped to a drain-source potential of the transistor 46 and the transistor 47. The transistor 46 and the transistor 47 operate as a clamp circuit which holds the voltage of the node C within a predetermined range from the third source voltage. In this embodiment, two transistors including the transistor 46 and the transistor 47 are used, but one or more transistors may be used depending on a clamp voltage. When the number of transistors is defined as n (where n is a natural number equal to or greater than 1), a drain-source potential of a transistor is defined as NchVth, and the potential of the third power supply terminal 103 is defined as VSS, the clamp voltage is represented as VSS+n× NchVth. The clamp voltage is determined according to a maximum input voltage of the capacitor 25.

One end of the capacitor 25 is connected to the connection point (the node C) between the drain of the transistor 44 and the load 42, and the other end is connected to a gate of the transistor 50. In the following description, the gate of the transistor 50 is also referred to as a node D.

The transistor 48 is a load transistor which fixes the potential of the node D to L at the time of normality. Specifically, the transistor 48 is a depression type N-channel MOSFET. A drain of the transistor 48 is connected to the node D. A gate, a source, and a bulk of the transistor 48 are connected to the third power supply terminal 103.

One end of the capacitor 26 is connected to the node D and the other end is grounded via the third power supply terminal 103.

The capacitor 25, the transistor 48, and the capacitor 26 break a DC component of the node C and do not transmit the DC component to the node D. The capacitor 25 transmits an AC component of the node C to the node D. That is, the capacitor 25, the transistor 48, and the capacitor 26 operate as a high-pass filter which transmits only the AC component in the case where the potential of the node C changes steeply from L to H.

The transistor 50 is an N-channel MOSFET. The gate of the transistor 50 is connected to the capacitor 25. A source and a bulk of the transistor 50 are grounded via the third power supply terminal 103. A drain of the transistor 50 is connected to the source and the gate of the transistor 49. In the following description, the transistor 50 may also be referred to as a seventh transistor. In the following description, a connection point between the drain of the transistor 50 and the source and the gate of the transistor 49 is also referred to as a node E.

The transistor 49 is a load transistor which fixes the potential of the node E to H at the time of normality. Specifically, the transistor 49 is a depression type N-channel MOSFET. The drain of the transistor 49 is connected to the second power supply terminal 102. The gate and the source of the transistor 49 are connected to the node E. The bulk of the transistor 49 is grounded via the third power supply terminal 103. In the following description, the transistor 49 may also be referred to as an eighth transistor.

The inverter 32 includes an input port, an output port, and a power supply terminal. The second power supply terminal 102 is connected to the power supply terminal of the inverter 32. The input port of the inverter 32 receives the voltage of the node E. The output port of the inverter 32 outputs the voltage increase detection signal DETR. That is, the erroneous detection prevention circuit 20 outputs a signal based on the potential of the connection point (the node E) between the connection point between the gate and the source of the transistor 49 and the drain of the transistor 50 as the voltage increase detection signal DETR.

The potential of the node E is based on the potential of the connection point (the node C) between the drain of the transistor 44 and the load 42. That is, the erroneous detection prevention circuit 20 can also be said to output a signal based on the potential of the node C as the voltage increase detection signal DETR.

[Operation of Erroneous Detection Prevention Circuit]

An example of the operation of the erroneous detection prevention circuit 20 will be described below with reference to FIG. 3.

In a normal state, that is, in the case where there is no voltage fluctuation of the first power supply terminal 101, the potential of the node C is L. The reason why the potential of the node C is L is the same as described above and is that the resistance value of the load 42 is set to be less than the on-resistance of the transistor 44. In other words, the potential of the connection point (the node C) between the drain of the transistor 44 and the load 42 in the case where the erroneous detection prevention circuit 20 is not detecting an increase in voltage of the first power supply terminal 101 is L.

The potential of the node C is clamped by the transistor 46 and the transistor 47. The case of two transistors is illustrated in the example illustrated in the drawing, but the number of transistors may be n (where n is a natural number equal to or greater than 1). When a drain-source potential of a transistor is defined as NchVth and the potential of the third power supply terminal 103 is defined as VSS, the clamp voltage is represented as VSS+n×NchVth.

The potential of the node D in the normal state is pulled down by the transistor 48 and thus is changed to L. Accordingly, the transistor 50 is turned off, and the potential of the node E is pulled up to the second power supply terminal 102 by the transistor 49 and thus is changed to H. Since the potential of the node E is H, the input port of the inverter 32 receives H, the inverter 32 outputs L, and the voltage increase detection signal DETR is changed to L. That is, the voltage increase detection signal DETR in the case where the erroneous detection prevention circuit 20 is not detecting an increase in voltage of the first power supply terminal 101 is L. Here, since the capacitor 25 which is a DC break capacitor is present between the node C and the node D, the potential of the node D is not affected by the first power supply terminal 101.

In the case where the voltage of the first power supply terminal 101 decreases steeply, the source potential of the transistor 44 decreases earlier by the time constant based on the resistor 23 and the capacitance of the parasitic diode 24 than the bulk potential thereof due to the resistor 23 present between the bulk of the transistor 44 and the first power supply terminal 101. Accordingly, since the transistor 44 is turned off due to a back-gate effect, the potential of the node C is held at L. Since the potential of the node C is held at L, the potential of the node D is held at L. Accordingly, the transistor 50 is held in the off state, and the node E is pulled up to the second power supply terminal 102 by the transistor 49 and holds H. Since the potential of the node E is held at H, the input port of the inverter 32 receives H, the inverter 32 outputs L, and the voltage increase detection signal DETR is held at L.

In the case where the voltage of the first power supply terminal 101 increases steeply, the source potential of the transistor 44 increases earlier by the time constant based on the resistor 23 and the capacitance of the parasitic diode 24 than the bulk potential thereof due to the resistor 23 present between the bulk of the transistor 44 and the first power supply terminal 101. Accordingly, since the transistor 44 is turned on due to a back-gate effect, the potential of the node C is changed from L to H. Since the potential of the node C is steeply changed to H, the capacitor transmits a signal changed from L to H as an AC component, and the potential of the node D is changed from L to H. Accordingly, the transistor 50 is turned on due to H received by the gate thereof, and the node E is pulled down to the third power supply terminal 103 by the transistor 50 and thus is changed from H to L. The resistance value of the transistor 49 is preferably set to be higher than the on-resistance of the transistor 50 such that the potential of the node E is changed to L when the transistor 50 is turned on. Since the potential of the node E is changed from H to L, the input port of the inverter 32 receives L, the inverter 32 outputs H, and the voltage increase detection signal DETR is changed to H.

At this time, the gate of the transistor 43 is protected by self-clamping. The gate of the transistor 44 is clamped by the transistor 45 and thus is protected. The transistor 45 operates as a clamp circuit which holds the gate voltage of the transistor 44 within a predetermined range from the first source voltage. The capacitor 25 and the gate of the transistor 50 are clamped by the transistor 46 and the transistor 47 and thus are protected. Accordingly, all the transistors in the erroneous detection prevention circuit 20 are protected in breakdown voltage.

Referring back to FIG. 1, when the voltage of the first power supply terminal 101 increases steeply and the voltage decrease detection signal DETF is erroneously output as H, the gate of the transistor 30 is changed to H by causing the erroneous detection prevention circuit 20 to output the voltage increase detection signal DETR as H, the transistor 30 is turned on, and thus the voltage decrease detection signal DETF is pulled down to the third power supply terminal 103 and is fixed to L. Accordingly, with the voltage fluctuation detection circuit 1, erroneous detection is not performed even when the voltage of the first power supply terminal 101 increases steeply and the voltage decrease detection signal DETF is erroneously output as H.

[Operation Timings]

Figure 4:
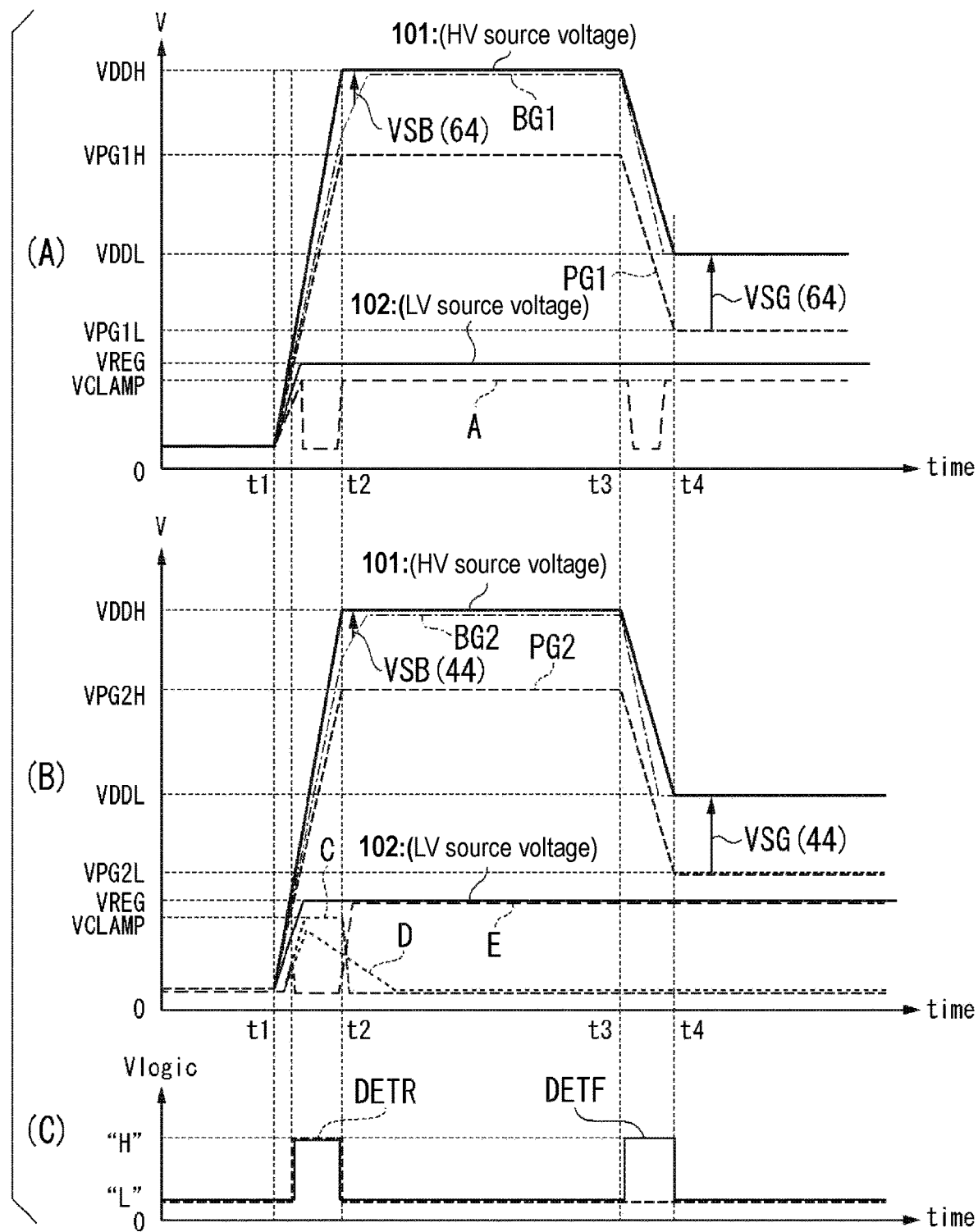
FIG. 4 is a timing chart illustrating an example of an operation of the voltage fluctuation detection circuit according to the embodiment.

FIG. 4 is a timing chart illustrating an example of the operation of the voltage fluctuation detection circuit 1 according to the first embodiment. Changes in voltage of the nodes when the voltage of the first power supply terminal 101 increases and decreases will be described below with reference to the drawing. (A) of FIG. 4 illustrates changes in potential of the nodes in the source voltage decrease detection circuit 10, (B) of FIG. 4 illustrates changes in potential of the nodes in the erroneous detection prevention circuit 20, and (C) of FIG. 4 illustrates changes in potential of the voltage decrease detection signal DETF and the voltage increase detection signal DETR. The drawings illustrate temporal changes in voltage with the vertical axis set to voltage and with the horizontal axis set to time. The time [time] on the horizontal axis is shared by (A) of FIG. 4, (B) of FIG. 4, and (C) of FIG. 4. The voltages [V] on the vertical axes in (A) of FIG. 4 and (B) of FIG. 4 are represented as analog values. The voltages [Vlogic] on the vertical axis in (C) of FIG. 4 are represented as digital values (H or L).

Operations when the voltage of the first power supply terminal 101 increases will be first described below. Before time t1, the voltage of the first power supply terminal 101 is 0. From time t1 to time t2, the voltage of the first power supply terminal 101 increases from 0 to a first HV source voltage level VDDH.

Changes in potential of the nodes in the source voltage decrease detection circuit 10 will be described below with reference to (A) of FIG. 4. In the drawing, the potential of the node A, the potential of the second power supply terminal 102, the potential of the node PG1, the potential of the node BG1, and the potential of the first power supply terminal 101 are illustrated. When the potential of the first power supply terminal 101 increases at time t1, the potential of the second power supply terminal 102, the potential of the node PG1, and the potential of the node BG1 also increase. As a result of the increase in potentials, the potential of the first power supply terminal 101 is fixed to the first HV source voltage level VDDH, the potential of the second power supply terminal 102 is fixed to an LV source voltage level VREG, and the potential of the node PG1 is fixed to a potential VPG1H. The potential of the node BG1 is fixed to a value which is less by the source-bulk voltage VSB of the transistor 64 than the first HV source voltage level VDDH which is the potential of the first power supply terminal 101.

Here, since the resistor 21 and the parasitic diode 22 are present in the bulk of the transistor 64, the bulk potential of the transistor 64 decreases later than the source potential thereof, and the transistor 64 is turned off. The period in which the transistor 64 is in the off state is based on the time constant which is determined by the resistor 21 and the parasitic diode 22. Since the transistor 64 is turned off, the potential of the node A is pulled down by the load 62 and thus is changed to L. Since the potential of the node A is changed to L, the inverter 31 receives L, and the inverter 31 outputs H. Accordingly, the voltage decrease detection signal DETF is changed to H as illustrated in (C) of FIG. 4.

When the bulk potential of the transistor 64 increases and the transistor 64 is turned on after a predetermined time has elapsed, the potential of the node A is changed to a voltage based on division with the transistor 64 and the load 62, and the potential of the node A is changed to H. Since the potential of the node A is H, the inverter 31 receives H, and the inverter 31 outputs L. Accordingly, the voltage decrease detection signal DETF is changed to L as illustrated in (C) of FIG. 4.

Changes in potential of the nodes in the erroneous detection prevention circuit 20 will be described below with reference to (B) of FIG. 4. In the drawing, the potential of the node C, the potential of the node D, the potential of the node E, the potential of the second power supply terminal 102, the potential of the node PG2, the potential of the node BG2, and the potential of the first power supply terminal 101 are illustrated. When the potential of the first power supply terminal 101 increases at time t1, the potential of the second power supply terminal 102, the potential of the node PG2, and the potential of the node BG2 also increase. As a result of the increase in potentials, the potential of the first power supply terminal 101 is fixed to the first HV source voltage level VDDH, the potential of the second power supply terminal 102 is fixed to the LV source voltage level VREG, and the potential of the node PG2 is fixed to a potential VPG2H. The potential of the node BG2 is fixed to a value which is less by the source-bulk voltage VSB of the transistor 44 than the first HV source voltage level VDDH which is the potential of the first power supply terminal 101.

In the period from time t1 to time t2, the potential of the node C increases. Since the node C is clamped by the transistor 46 and the transistor 47, the potential of the node C is fixed to a clamp voltage VCLAMP. The capacitor 26 is charged with electric charges with the steep change in potential of the node C. Since the capacitor 26 is charged with electric charges, the potential of the D increases with the increase in potential of the node C until the potential of the node C reaches the clamp voltage VCLAMP. When the change in potential of the node C does not occur any more, the electric charges with which the capacitor 26 is charged are discharged to the third power supply terminal 103 via the transistor 48.

In the period from time t1 to time t2, the potential of the node E increases once, and the transistor 50 is turned on and the potential of the node E is changed to L when the potential of the node D increases to an operating voltage of the transistor 50 due to charging of the capacitor 26 with electric charges. With the potential of the node E being changed to L, the inverter 32 receives L, and the inverter 32 outputs H. That is, as illustrated in (C) of FIG. 4, the voltage increase detection signal DETR is changed to H with the steep increase in potential of the first power supply terminal 101.

Referring back to (B) of FIG. 4, since the potential of the node C is fixed to the clamp voltage VCLAMP, the electric charges with which the capacitor 26 is charged are discharged to the third power supply terminal 103 via the transistor 48 and the potential of the node D decreases slowly. A discharge time constant of the node D is determined by the capacitor 26 and a resistive component of the transistor 48. When the potential of the node D decreases and becomes less than the operating voltage of the transistor 50, the transistor 50 is turned off, the node E is pulled up to the second power supply terminal 102 by the transistor 49, and the potential of the node E is changed to H. With the potential of the node E being changed to H, the inverter 32 receives H, and the inverter 32 outputs L. That is, as illustrated in (C) of FIG. 4, the voltage increase detection signal DETR is changed to L when a predetermined time elapses after the potential of the first power supply terminal 101 has increased steeply. The predetermined time which is a pulse width of the voltage increase detection signal DETR is determined by the discharge time constant of the node D.

Operations when the voltage of the first power supply terminal 101 decreases will be described below. From time t3 to time t4, the voltage of the first power supply terminal 101 decreases from the first HV source voltage level VDDH to a second HV source voltage level VDDL.

Changes of the potentials of the nodes in the source voltage decrease detection circuit 10 will be described below with reference to (A) of FIG. 4. When the potential of the first power supply terminal 101 decreases at time t3, the potential of the node PG1 and the potential of the node BG1 also decrease. With the decrease in potential, the potential of the first power supply terminal 101 and the potential of the node BG1 are fixed to the second HV source voltage level VDDL. The potential of the node PG1 is fixed to a potential VPG1L which is lower by the source-gate voltage VSG of the transistor 64 than the second HV source voltage level VDDL which is the potential of the first power supply terminal 101.

Here, since the resistor 21 and the parasitic diode 22 are present in the bulk of the transistor 64, the bulk voltage of the transistor 64 decreases later than the source voltage and the transistor 64 is turned off as a result. The period in which the transistor 64 is in the off state is based on the time constant which is determined by the resistor 21 and the parasitic diode 22. Since the transistor 64 is turned off, the potential of the node A is pulled down to L by the load 62. Since the potential of the node A is L, the inverter 31 receives L, and the inverter 31 outputs H. Accordingly, the voltage decrease detection signal DETF is changed to H as illustrated in (C) of FIG. 4.

When the bulk potential of the transistor 64 increases with the elapse of a predetermined time and the transistor 64 is turned on as a result, the potential of the node A is changed again to a voltage obtained by division using the transistor 64 and the load 62, and the potential of the node A is changed to H. Since the potential of the node A is H, the inverter 31 receives H, and the inverter 31 outputs L.

Accordingly, the voltage decrease detection signal DETF is changed to L as illustrated in (C) of FIG. 4.

Changes of the potentials of the nodes in the erroneous detection prevention circuit 20 will be described below with reference to (B) of FIG. 4. When the potential of the first power supply terminal 101 decreases at time t3, the potential of the node PG2 and the potential of the node BG2 also decrease. With the decrease in potential, the potential of the first power supply terminal 101 and the potential of the node BG2 are fixed to the second HV source voltage level VDDL. The potential of the node PG2 is fixed to a potential VPG2L which is smaller by the source-gate voltage VSG of the transistor 44 than the second HV source voltage level VDDL which is the potential of the first power supply terminal 101.

When the voltage of the first power supply terminal 101 decreases, the transistor 44 is turned off due to the resistor 23 and the parasitic diode 24, but the potential of the node C is at the L level already and thus the potential of the node C is not changed. That is, when the voltage of the first power supply terminal 101 decreases, the voltage increase detection signal DETR is not changed and held at L.

[Conclusion of First Embodiment]

According to the aforementioned embodiment, since the voltage fluctuation detection circuit 1 includes the source voltage decrease detection circuit 10 configured to detect a decrease in voltage of the first power supply terminal 101 and to output the result of detection as a voltage decrease detection signal DETF using a voltage which is lower than the voltage of the first power supply terminal 101, the erroneous detection prevention circuit 20 configured to detect an increase in voltage of the first power supply terminal 101 and to output the result of detection as a voltage increase detection signal DETR using a voltage which is lower than the voltage of the first power supply terminal 101, and the transistor 30 configured to invalidate outputting of the voltage decrease detection signal DETF in a period in which the increase in voltage of the first power supply terminal 101 is being detected based on the voltage increase detection signal DETR. Accordingly, according to this embodiment, even when the source voltage decrease detection circuit 10 erroneously outputs the voltage decrease detection signal DETF at the time of starting of a power supply, it is possible to curb erroneous detection using the erroneous detection prevention circuit 20.

Here, in the case where it is intended to detect a voltage fluctuation of a battery in the related art, an element such as a thick-film transistor with a high gate breakdown voltage (a semiconductor element with a high breakdown voltage) needs to be used. In the case where a thick-film transistor (a semiconductor element with a high breakdown voltage) is used, a thick-film manufacturing process has to be used and there is a problem in an increase in cost in comparison with a case in which a thin-film manufacturing process is used. In the case where a thick-film transistor (a semiconductor element with a high breakdown voltage) is used, there is a problem in that it is more difficult to obtain desired electrical characteristics in comparison with a thin-film transistor (a semiconductor element with a low breakdown voltage).

According to the first embodiment, the source voltage decrease detection circuit 10 is configured as the circuit illustrated in FIG. 2, and all of the transistor 63, the transistor 64, and the transistor 65 are thin-film transistors (semiconductor elements with a low breakdown voltage). That is, the source voltage decrease detection circuit 10 detects a voltage fluctuation in a 12 V system without using a thick-film transistor (a semiconductor element with a high breakdown voltage). Accordingly, according to this embodiment, since thick-film processes are not used, it is possible to manufacture the source voltage decrease detection circuit at low cost. According to this embodiment, since thick-film processes are not used, it is possible to broaden the range of processes capable of manufacturing the source voltage decrease detection circuit 10 and to increase a degree of freedom in selecting processes.

According to the first embodiment, the erroneous detection prevention circuit 20 uses a capacitive component of a parasitic diode to determine the time constant of the transistor 64. Accordingly, according to this embodiment, since a capacitor with a high breakdown voltage is not used, it is possible to manufacture source voltage decrease detection circuit 10 without using thick-film processes. Accordingly, it is possible to achieve a decrease in cost and an increase in a degree of freedom in selecting processes.

According to the first embodiment, the erroneous detection prevention circuit 20 is configured as the circuit illustrated in FIG. 3, and all of the transistor 43, the transistor 44, and the transistor 45 are thin-film transistors (semiconductor elements with a low breakdown voltage). That is, the erroneous detection prevention circuit 20 detects a voltage fluctuation in a 12 V system without using a thick-film transistor (a semiconductor element with a high breakdown voltage). Accordingly, according to this embodiment, since thick-film processes are not used, it is possible to manufacture the erroneous detection prevention circuit at low cost. According to this embodiment, since thick-film processes are not used, it is possible to broaden the range of processes capable of manufacturing the erroneous detection prevention circuit 20 and to increase a degree of freedom in selecting processes.

According to the first embodiment, the erroneous detection prevention circuit 20 is configured as the circuit illustrated in FIG. 3. That is, the erroneous detection prevention circuit includes the capacitor 25 to break a DC component, to draw out only a signal component in the case where the potential of the first power supply terminal 101 increases, and determine the period in which the transistor 50 is in the on state using the transistor 48 and the capacitor 26. Accordingly, the erroneous detection prevention circuit 20 can output a pulse in a predetermined period in the case where the potential of the first power supply terminal 101 increases and can invalidate the output even if the source voltage decrease detection circuit 10 performs erroneous detection in the case where the potential of the first power supply terminal 101 increases. Since no capacitive element and no transistor in the erroneous detection prevention circuit 20 employ thick-film processes, it is possible to broaden the range of processes capable of manufacturing the erroneous detection prevention circuit 20 and to increase a degree of freedom in selecting processes.

According to the first embodiment, the resistance values are set such that the voltage obtained by dividing the voltage of the first power supply terminal 101 using the transistor 64 and the load 62 is higher than the voltage obtained by dividing the voltage of the first power supply terminal 101 using the transistor 44 and the load 42. Accordingly, in the case where the source voltage decrease detection circuit 10 is not detecting a decrease in voltage of the first power supply terminal 101, the potential of the node A is H and the potential of the node C is L. As a result, according to this embodiment, it is possible to detect a steep change of the potential of the first power supply terminal 101.

Second Embodiment

[Circuit Configuration of Source Voltage Decrease Detection Circuit]

Figure 5:
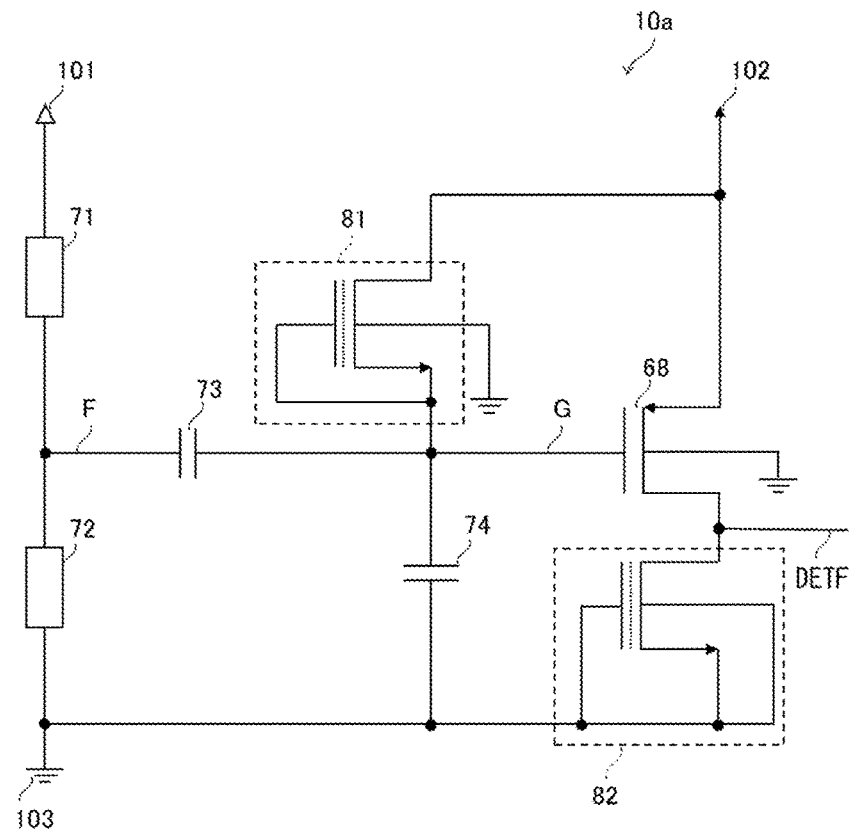
FIG. 5 is a circuit diagram illustrating another example of the circuit configuration of the source voltage decrease detection circuit according to the embodiment.

FIG. 5 is a circuit diagram illustrating an example of a circuit configuration of a source voltage decrease detection circuit 10a according to a second embodiment. An example of a detailed circuit configuration of the source voltage decrease detection circuit 10a will be described below with reference to FIG. 5. The source voltage decrease detection circuit 10a includes a load 81, a load 82, a transistor 68, a resistor 71, a resistor 72, a capacitor 73, and a capacitor 74.

A first power supply terminal 101 illustrated in FIG. 5 is an example of a power supply terminal which is connected to a power supply (a first power supply) serving as a detection target of the voltage fluctuation detection circuit 1, and a second power supply terminal 102 is an example of a power supply terminal which is connected to a logical power supply (a second power supply) used for signal processing. A third power supply terminal 103 is, for example, a ground potential or a negative source potential. Accordingly, the first power supply terminal 101 and the second power supply terminal 102 use the third power supply terminal 103 as a common reference potential.

Connection of the source voltage decrease detection circuit 10a will be described below. A first terminal of the resistor 71 is connected to the first power supply terminal 101. A second terminal of the resistor 71 is connected to a first terminal of the resistor 72 and a first terminal of the capacitor 73 via a node F. A second terminal of the capacitor 73 is connected to the load 81, a first terminal of the capacitor 74, and a gate terminal of the transistor 68 via a node G. A source terminal of the transistor 68 is connected to the second power supply terminal 102. A drain terminal of the transistor 68 is connected to the load 82. The transistor 68 is an enhancement type P-channel MOS transistor which outputs a voltage decrease detection signal DETF from the drain terminal thereof. A second terminal of the resistor 72 and a second terminal of the capacitor 74 are connected to the third power supply terminal 103.

The load 81 and the load 82 are current source loads. The load 81 and the load 82 include a depression type N-channel MOS transistor. A drain terminal of the depression type N-channel MOS transistor of the load 81 is connected to the second power supply terminal 102, a gate terminal and a source terminal thereof are connected to the node G, and a bulk thereof is connected to the third power supply terminal 103. The load 81 performs an operation of charging the capacitor 74 and holding the potential of the node G at H. A drain terminal of the depression type N-channel MOS transistor of the load 82 is connected to the drain terminal of the transistor 68, and a gate terminal, a source terminal, and a bulk thereof are connected to the third power supply terminal 103. The load 82 performs an operation of holding the potential of the drain terminal of the transistor 68 at L.

Operations of the source voltage decrease detection circuit 10a will be described below. The resistor 71 and the resistor 72 step down a first source voltage of the first power supply terminal 101 by division. The capacitor 73 and the capacitor 74 operate as DC break capacitors.

Here, the maximum voltage of the first power supply terminal 101 is 28 V, the voltage of the second power supply terminal 102 is 3.6 V, the transistors thereof are thin-film transistors (semiconductor elements with a low breakdown voltage) with a small gate film thickness, and a dielectric breakdown voltage of the gate terminals of the transistors is 3.6 V. When a division ratio of the resistor 71 and the resistor 72 is 9:1, a maximum voltage of 2.8 V is applied to the gate terminals of the transistors. The node G is isolated from the node F by the capacitor 73 in view of a direct current. The potential of the node G is held at H by the load 81. Since the gate terminal of the transistor 68 receives H, a voltage decrease detection signal DETF of L is output from the drain terminal thereof.

It is assumed that the voltage of the first power supply terminal 101 has decreased steeply. A steep voltage fluctuation signal is transmitted from the node F at which the voltage of the first power supply terminal 101 is divided by the resistor 71 and the resistor 72 to the node G via the capacitor 73, and the potential of the node G is changed from H to L. The transistor 68 is turned on, and the drain terminal of the transistor 68 outputs a voltage decrease detection signal DETF of H. The voltage of the node G changed to L is changed again to H by causing the load 81 to charge the capacitor 74. With the potential of the node G being changed to H, the transistor 68 is turned off again, and the drain terminal of the transistor 68 outputs a voltage decrease detection signal DETF of L.

[Circuit Configuration of Erroneous Detection Prevention Circuit]

Figure 6:
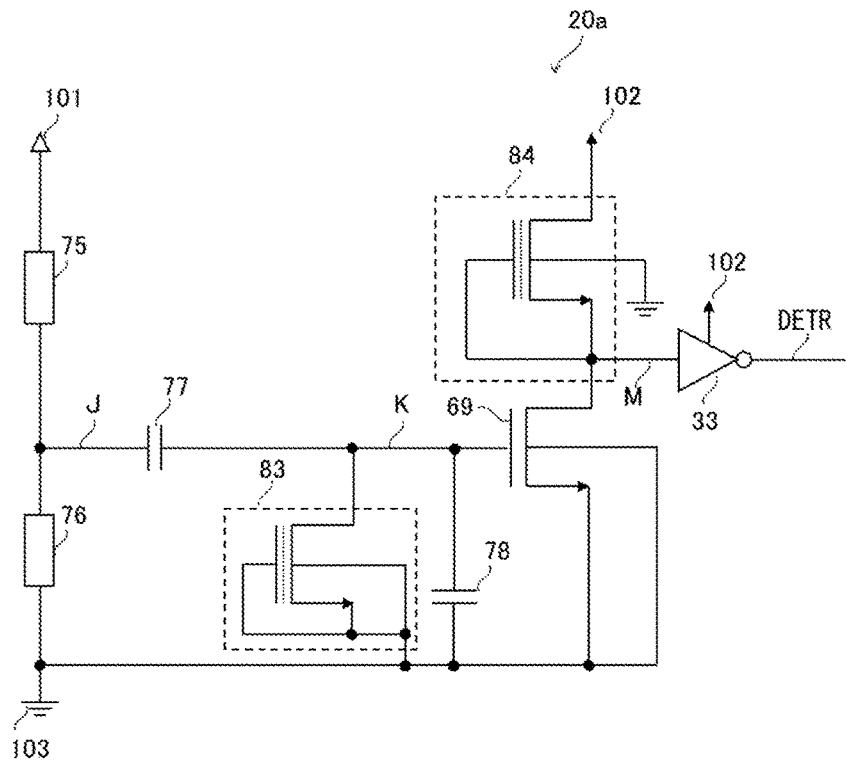
FIG. 6 is a circuit diagram illustrating another example of the circuit configuration of the erroneous detection prevention circuit according to the embodiment.

FIG. 6 is a circuit diagram illustrating an example of a circuit configuration of an erroneous detection prevention circuit 20a according to the second embodiment. An example of a detailed circuit configuration of the erroneous detection prevention circuit 20a will be described below with reference to FIG. 6. The erroneous detection prevention circuit 20a includes a load 83, a load 84, a transistor 69, an inverter 33, a resistor 75, a resistor 76, a capacitor 77, and a capacitor 78.

The first power supply terminal 101 illustrated in FIG. 6 is an example of the power supply terminal which is connected to the power supply (the first power supply) serving as a detection target of the voltage fluctuation detection circuit 1, and the second power supply terminal 102 is an example of a power supply terminal which is connected to a logical power supply (a second power supply) used for signal processing. A third power supply terminal 103 is, for example, a ground potential or a negative source potential. Accordingly, the first power supply terminal 101 and the second power supply terminal 102 use the third power supply terminal 103 as a common reference potential.

Connection of the erroneous detection prevention circuit 20a will be described below. A first terminal of the resistor 75 is connected to the first power supply terminal 101. A second terminal of the resistor 75 is connected to a first terminal of the resistor 76 and a first terminal of the capacitor 77 via a node J. A second terminal of the capacitor 77 is connected to the load 83, a first terminal of the capacitor 78, and a gate terminal of the transistor 69 via a node K. A drain terminal of the transistor 69 is connected to the load 84 and an input port of the inverter 33 via a node M. A source terminal and a bulk of the transistor 69 are connected to the third power supply terminal 103. The transistor 69 is an enhancement type N-channel MOS transistor which outputs a voltage increase detection signal DETR from the drain terminal thereof via the node M and the inverter 33. A second terminal of the resistor 76 and a second terminal of the capacitor 78 are connected to the third power supply terminal 103. A power supply terminal of the inverter 33 is connected to the second power supply terminal 102. The inverter 33 outputs a voltage increase detection signal DETR from an output port thereof.

The load 83 and the load 84 are current source loads. The load 83 and the load 84 include a depression type N-channel MOS transistor. A drain terminal of the depression type N-channel MOS transistor of the load 83 is connected to the node K, and a gate terminal, a source terminal, and a bulk thereof are connected to the third power supply terminal 103. The load 83 performs an operation of discharging the capacitor 78 and holding the potential of the node K at L. A drain terminal of the depression type N-channel MOS transistor of the load 84 is connected to the second power supply terminal 102, a gate terminal and a source terminal thereof are connected to the node M, and a bulk thereof is connected to the third power supply terminal 103. The load 84 performs an operation of holding the potential of the node M at H.

Operations of the erroneous detection prevention circuit 20a will be described below. The resistor 75 and the resistor 76 step down the first source voltage of the first power supply terminal 101 by division. The capacitor 77 and the capacitor 78 operate as DC break capacitors.

Here, the maximum voltage of the first power supply terminal 101 is 28 V, the voltage of the second power supply terminal 102 is 3.6 V, the transistors thereof are thin-film transistors (semiconductor elements with a low breakdown voltage) with a small gate film thickness, and a dielectric breakdown voltage of the gate terminals of the transistors is 3.6 V. When a division ratio of the resistor 75 and the resistor 76 is 9:1, a maximum voltage of 2.8 V is applied to the gate terminals of the transistors. The node K is isolated from the node J by the capacitor 77 in view of a direct current. In a normal state, the potential of the node J is held at L by the load 83. Since the gate terminal of the transistor 69 receives L, the drain terminal thereof is held at H. The inverter 33 connected to the drain terminal via the node M outputs a voltage increase detection signal DETR of L from the output port thereof.

It is assumed that the voltage of the first power supply terminal 101 has increased steeply to 28 V (a maximum operating voltage). A steep voltage fluctuation signal is transmitted from the node J at which the voltage of the first power supply terminal 101 is divided by the resistor 75 and the resistor 76 to the node K via the capacitor 77, and the potential of the node K is changed from L to H. The transistor 69 is turned on, and the potential of the node M is changed to H to L. The inverter 33 outputs a voltage increase detection signal DETR of H. The voltage of the node K changed to H is changed again to L by causing the load 83 to discharge the capacitor 78. With the potential of the node K being changed to L, the transistor 69 is turned off again, and the potential of the node M is changed from L to H. The inverter 33 outputs a voltage increase detection signal DETR of L.

According to the second embodiment, the source voltage decrease detection circuit 10a is configured as the circuit illustrated in FIG. 5, and all of the transistor constituting the load 81, the transistor constituting the load 82, and the transistor 68 are thin-film transistors (semiconductor elements with a low breakdown voltage). That is, the source voltage decrease detection circuit 10a detects a voltage fluctuation in a 12 V system without using a thick-film transistor (a semiconductor element with a high breakdown voltage). Accordingly, according to this embodiment, since thick-film processes are not used, it is possible to manufacture the source voltage decrease detection circuit at low cost. According to this embodiment, since thick-film processes are not used, it is possible to broaden the range of processes capable of manufacturing the source voltage decrease detection circuit 10a and to increase a degree of freedom in selecting processes.

According to the second embodiment, the erroneous detection prevention circuit 20a is configured as the circuit illustrated in FIG. 6, and all of the transistor constituting the load 83, the transistor constituting the load 84, and the transistor 69 are thin-film transistors (semiconductor elements with a low breakdown voltage). That is, the erroneous detection prevention circuit 20a detects a voltage fluctuation in a 12 V system without using a thick-film transistor (a semiconductor element with a high breakdown voltage). Accordingly, according to this embodiment, since thick-film processes are not used, it is possible to manufacture the erroneous detection prevention circuit at low cost. According to this embodiment, since thick-film processes are not used, it is possible to broaden the range of processes capable of manufacturing the erroneous detection prevention circuit 20a and to increase a degree of freedom in selecting processes.

It will be apparent to those skilled in the art that various modifications and variations can be made to the disclosed embodiments without departing from the scope or spirit of the present invention. In view of the foregoing, it is intended that the present invention covers modifications and variations provided that they fall within the scope of the following claims and their equivalents.

What is claimed is:

1. A voltage fluctuation detection circuit comprising:
   a source voltage decrease detection circuit configured to detect a decrease in voltage of a first power supply which outputs a first voltage and to output a result of detection as a voltage decrease detection signal using a second voltage of a second power supply which is lower than the voltage of the first power supply;
   an erroneous detection prevention circuit configured to detect an increase in voltage of the first power supply and to output a result of detection as a voltage increase detection signal using the second voltage; and
   a mask circuit configured to invalidate outputting of the voltage decrease detection signal in a period in which the increase in voltage of the first power supply is being detected based on the voltage increase detection signal.

2. The voltage fluctuation detection circuit according to claim 1, wherein the mask circuit includes a first transistor of which a gate is connected to the erroneous detection prevention circuit, a drain is connected to the source voltage decrease detection circuit, and a source is connected to a third power supply.

3. The voltage fluctuation detection circuit according to claim 1, wherein the source voltage decrease detection circuit includes:
   a second transistor of which a source and a back-gate are connected to the first power supply and a gate and a drain are connected to each other;
   a third transistor of which a gate is connected to a connection point between the gate and the drain of the second transistor, a source is connected to the first power supply, a drain is connected to an input port of an inverter and a first clamp circuit, and a back-gate is connected to a second clamp circuit and to the first power supply via a first resistor; and
   the inverter which is driven with the second power supply and outputs the voltage decrease detection signal.

4. The voltage fluctuation detection circuit according to claim 3, wherein the second clamp circuit clamps a voltage of the back-gate of the third transistor such that the voltage of the back-gate of the third transistor does not deviate from the voltage of the first power supply by a predetermined voltage or more, and wherein the first clamp circuit clamps an input voltage of the inverter such that the input voltage of the inverter does not deviate from a voltage of a third power supply by a predetermined voltage or more.

5. The voltage fluctuation detection circuit according to claim 1, wherein the erroneous detection prevention circuit includes:

a fourth transistor of which a source and a back-gate are connected to the first power supply and a gate and a drain are connected to each other; and a fifth transistor of which a gate is connected to a connection point between the gate and the drain of the fourth transistor, a source is connected to the first power supply, a drain is connected to a gate of a transistor via a first capacitor, and a back-gate is connected to a third clamp circuit and to the first power supply via a second resistor, wherein the third clamp circuit includes a sixth transistor of which a gate and a drain are connected to each other, a source and a bulk are connected to each other, and a connection point between the source and the bulk is connected to the gate of the fourth transistor and the gate of the fifth transistor.

6. The voltage fluctuation detection circuit according to claim 5, wherein the third clamp circuit clamps a voltage of the back-gate of the fifth transistor such that the voltage of the back-gate of the fifth transistor does not deviate from the voltage of the first power supply by a predetermined voltage or more.

7. The voltage fluctuation detection circuit according to claim 1, wherein the source voltage decrease detection circuit includes:

a third resistor of which a first terminal is connected to the first power supply and a second terminal is connected to a first terminal of a fourth resistor and a first terminal of a third capacitor;

the fourth resistor of which a second terminal is connected to a third power supply;

the third capacitor of which a second terminal is connected to a gate of a seventh transistor; and the seventh transistor of which a source terminal is connected to the second power supply and a drain terminal outputs the voltage decrease detection signal.

8. The voltage fluctuation detection circuit according to claim 1, wherein the erroneous detection prevention circuit includes:

a fifth resistor of which a first terminal is connected to the first power supply and a second terminal is connected to a first terminal of a sixth resistor and a first terminal of a fifth capacitor;

the sixth resistor of which a second terminal is connected to a third power supply;

the fifth capacitor of which a second terminal is connected to a gate of an eighth transistor; and the eighth transistor of which a drain terminal is connected to an input port of an inverter and a source terminal is connected to the third power supply.

* * * * *